(12) United States Patent
Park et al.

(10) Patent No.: US 9,053,987 B2
(45) Date of Patent: Jun. 9, 2015

(54) ETCHING DEVICE USEFUL FOR MANUFACTURING A DISPLAY DEVICE

(71) Applicant: Samsung Display Co., Ltd., Yongin, Gyeonggi-do (KR)

(72) Inventors: Hongsick Park, Yongin (KR); Seon-il Kim, Yongin (KR)

(73) Assignee: Samsung Display Co., Ltd. (KR)

(*) Notice: Subject to any disclaimer, the term of this patent is extended or adjusted under 35 U.S.C. 154(b) by 0 days.

(21) Appl. No.: 14/267,167

(22) Filed: May 1, 2014

(65) Prior Publication Data

US 2015/0118776 A1   Apr. 30, 2015

(30) Foreign Application Priority Data

Oct. 30, 2013 (KR) .................. 10-2013-0130467

(51) Int. Cl.
   *H01L 21/302* (2006.01)
   *H01L 27/12* (2006.01)
   *H01L 29/40* (2006.01)
   *H01L 21/48* (2006.01)
   *H01L 21/67* (2006.01)

(52) U.S. Cl.
   CPC ............ *H01L 27/1259* (2013.01); *H01L 29/40* (2013.01); *H01L 21/4814* (2013.01); *H01L 21/67069* (2013.01); *H01L 2933/0016* (2013.01)

(58) Field of Classification Search
   None
   See application file for complete search history.

(56) References Cited

U.S. PATENT DOCUMENTS

| 5,607,602 A | 3/1997 | Su et al. |
| 2005/0003090 A1 | 1/2005 | Miyakawa |
| 2010/0219157 A1* | 9/2010 | Matsumoto .................. 216/37 |

FOREIGN PATENT DOCUMENTS

| JP | 06-097122 | 4/1994 |
| JP | 08-162443 | 6/1996 |
| JP | 09-293701 | 11/1997 |
| JP | 2001-023458 | 1/2001 |
| JP | 2011-181784 | 9/2011 |
| KR | 10-1996-0026122 | 7/1996 |
| KR | 10-2009-0016815 | 2/2009 |

* cited by examiner

*Primary Examiner* — Kyoung Lee
(74) *Attorney, Agent, or Firm* — Knobbe Martens Olson & Bear LLP

(57) ABSTRACT

A manufacturing method of a display device includes: forming a thin film transistor on a substrate, forming a pixel electrode connected to the thin film transistor, and forming a common electrode insulated from the pixel electrode. At least one of forming the pixel electrode and forming the common electrode includes: forming an electrode layer on the substrate, coating a photoresist on the electrode layer to form a first electrode sub-layer on which the photoresist is coated and a second electrode sub-layer on which the photoresist is not coated, generating etching vapor by heating an etching solution in a double boiler, and etching the second electrode sub-layer by using the etching vapor.

19 Claims, 11 Drawing Sheets

ETCHING DEVICE USEFUL FOR MANUFACTURING A DISPLAY DEVICE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This U.S. non-provisional patent application claims priority under 35 U.S.C. §119 to Korean Patent Application No. 10-2013-0130467, filed on Oct. 30, 2013, the entire contents of which are hereby incorporated by reference.

BACKGROUND

1. Field

Embodiments disclosed herein relate to an etching device which decreases the loss of an etching solution and etches an electrode layer providing a good etching profile, an etching method using the same and a manufacturing method of a display device using the etching method.

2. Description of the Related Technology

Recently, flat panel display devices such as a liquid crystal display device, an organic light emitting display device or a plasma display plane (PDP), have received attention to solve some of the defects of heavy and large-sized conventional display devices such as a cathode ray tube.

A liquid crystal display device is one of the most widely used flat panel display devices at present. Generally, the liquid crystal display device includes a display substrate comprising thin film transistors formed thereon as switching devices for driving pixels. The display substrate includes a plurality of metal patterns, and the metal patterns are mainly formed through a photolithography process.

To perform the photolithography process, a photoresist layer is typically formed on an electrode layer on the substrate, and the photoresist layer is exposed and developed to form a photoresist pattern. The photoresist pattern is used as an etching prevention layer. Through etching the electrode layer, the electrode layer may be patterned.

SUMMARY OF CERTAIN INVENTIVE ASPECTS

Embodiments provide an etching device of an electrode layer that decreases the loss of an etching solution and provides a good etching profile having a low CD skew value without residue.

Embodiments also provide an etching method of an electrode layer that decreases the loss of an etching solution and provides a good etching profile having a low CD skew value without residue.

Embodiments also provide a manufacturing method of a display device that decreases the loss of an etching solution and provides a display device comprising a good etching profile having a low CD skew value without residue.

Embodiments provide an etching device comprising a container holding an etching solution, a thermostatic bath and an electrode layer. The thermostatic bath holds the container therein and includes a heated solvent configured to heat the etching solution in a double boiler to produce etching vapor. The electrode layer is formed on a substrate. The etching vapor produced by the etching solution heated in the double boiler is configured to etch the electrode layer. The electrode layer may include polycrystalline indium tin oxide (a-ITO) or amorphous indium tin oxide (a-ITO). The etching solution may include at least one acid selected from the group consisting of hydrochloric acid (HCl), nitric acid ($HNO_3$), sulfuric acid ($H_2SO_4$), phosphoric acid ($H_3PO_4$) and perchloric acid ($HClO_4$). The temperature of the thermostatic bath may be from about 40° C. to about 80° C. The solvent may be water.

In other embodiments, an etching method includes forming an electrode layer on a substrate, coating a photoresist on the electrode layer to form a first electrode sub-layer on which the photoresist is coated and a second electrode sub-layer on which the photoresist is not coated, generating etching vapor by heating an etching solution in a double boiler, and etching the second electrode sub-layer by using the etching vapor.

In some embodiments, heating the etching solution in the double boiler may be performed in a thermostatic bath between about 40° C. and about 80° C.

In other embodiments, the etching method may further include disposing the substrate above the thermostatic bath. The substrate may be disposed above the thermostatic bath so that the first electrode sub-layer and the second electrode sub-layer may face the etching solution.

In still other embodiments, the etching method may further include transporting the substrate in a parallel direction to the substrate, and may further include transporting the thermostatic bath in the parallel direction. The etching of the second electrode sub-layer may be performed for about 10 to about 60 seconds.

In still other embodiments of the present invention, a manufacturing method of a display device includes forming a thin film transistor on a substrate, forming a pixel electrode connected to the thin film transistor, and forming a common electrode insulated from the pixel electrode.

At least one of forming the pixel electrode and forming the common electrode includes forming an electrode layer on the substrate, coating a photoresist on the electrode layer to form a first electrode sub-layer on which the photoresist is coated and a second electrode sub-layer on which the photoresist is not coated, generating etching vapor by heating an etching solution in a double boiler, and etching the second electrode sub-layer by using the etching vapor.

In some embodiments, heating the etching solution in the double boiler may be performed in a thermostatic bath between about 40° C. and about 80° C.

In other embodiments, the manufacturing method of a display device may further include disposing the substrate above the thermostatic bath. The substrate may be disposed above the thermostatic bath so that the first electrode sub-layer and the second electrode sub-layer may face the etching solution.

In still other embodiments, the manufacturing method of a display device may further include transporting the substrate in a parallel direction to the substrate. The manufacturing method of a display device may further include transporting the thermostatic bath in the parallel direction. The etching of the second electrode layer may be performed for about 10 to about 60 seconds.

In an etching device of an electrode layer according to an embodiment, the loss of an etching solution may be decreased, and a good etching profile having a low CD skew value without generating residue may be provided.

In an etching method of an electrode layer according to an embodiment, the loss of an etching solution may be decreased, and a good etching profile having a low CD skew value without generating residue may be provided.

In a manufacturing method of a display device according to an embodiment, the loss of an etching solution may be decreased, and a display device having a good etching profile having a low CD skew value without generating residue may be provided.

BRIEF DESCRIPTION OF THE DRAWINGS

The accompanying drawings are included to provide a further understanding of embodiments of the present invention, and are incorporated in and constitute a part of this specification. The drawings illustrate certain embodiments of the present invention and, together with the description, serve to explain principles of the present invention.

DETAILED DESCRIPTION OF CERTAIN INVENTIVE EMBODIMENTS

Figure 1:
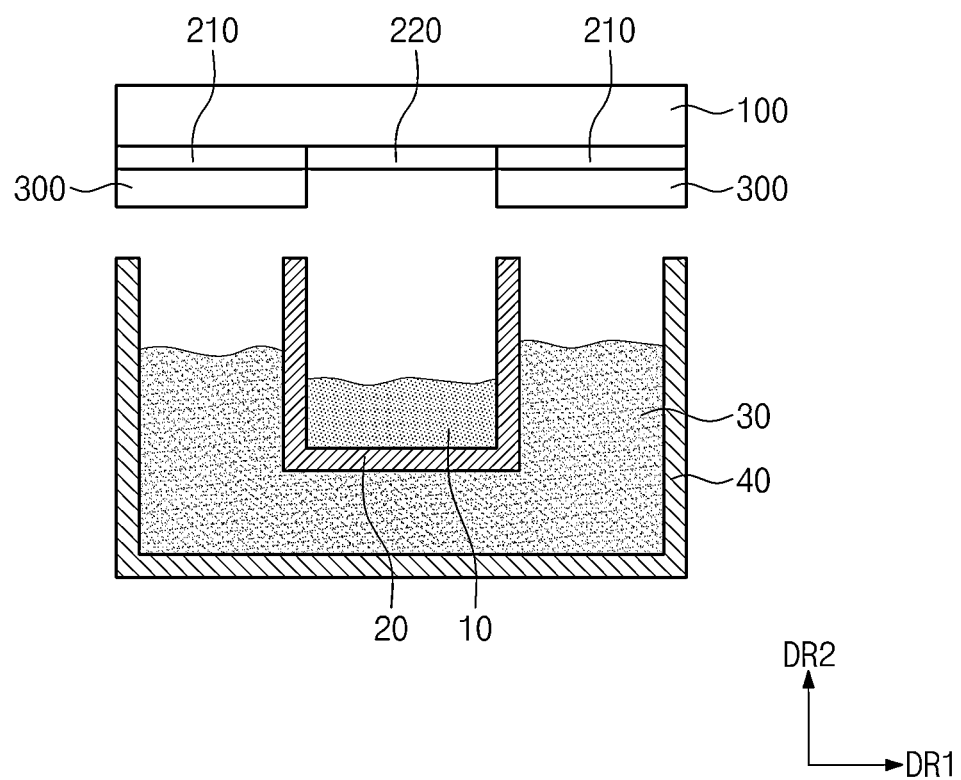
FIG. 1 is a cross-sectional view illustrating an etching device of an electrode layer according to an embodiment.

Certain embodiments are described below in more detail with reference to the accompanying drawings. Embodiments may, however, be embodied in different forms and should not be construed as limited to the embodiments set forth herein. Rather, these embodiments are provided so that this disclosure will be thorough and complete, and will fully convey the scope of the present invention to those skilled in the art.

In the drawings, the dimensions of layers and regions may be exaggerated for clarity of illustration. Like reference numerals generally refer to like elements throughout. It will be understood that when a layer, a film, a region, a plate, or the like, is referred to as being 'on' another layer, film, region, plate or the like, it can be directly on the other part, or intervening parts may also be present.

As methods for etching the electrode layer, a dry etching method and a wet etching method may be used, and the wet etching method is widely used for uniform etching and considering productivity.

To accomplish a display device having a high resolution, a low CD skew value is desired. When the etching is performed through the wet etching method, a large CD skew value may be obtained, and the realization of a display device having a high resolution may be difficult.

In addition, when the etching is performed through the wet etching method, the etching may be performed by using an etching solution in a liquid state. Thus, considerable loss of the etching solution may be generated, and residue may be produced on an electrode layer due to a low etching rate.

Hereinafter an etching device of an electrode layer according to an embodiment will be explained.

FIG. 1 is a cross-sectional view illustrating an etching device of an electrode layer according to an embodiment.

Referring to FIG. 1, the etching device of an electrode layer includes a container 20 holding an etching solution 10 and a thermostatic bath 40. The thermostatic bath 40 holds the container 20 therein and includes a solvent 30 to heat in a double boiler.

The etching solution 10 is heated in the double boiler and generates etching vapor, and a second electrode layer 220 formed on a substrate 100 may be etched by the etching vapor. The substrate 100 includes a first electrode layer 210 coated with a photoresist 300 and the second electrode layer 220 not coated with the photoresist 300.

Generally, when the electrode layer formed on the substrate is wet etched, a length difference of the electrode layer before and after the etching is generated. This length difference of the electrode layer before and after the etching is called a CD skew.

The etching vapor generated by the heating of the etching solution 10 in the double boiler evaporates and makes a contact with the second electrode layer 220 formed on the substrate 100 in a vertical direction. Therefore, when the second electrode layer 220 is etched by using the etching vapor, the length difference of the electrode layer before and after the etching may be decreased, and the CD skew value may be lowered.

Additionally, when the electrode layer formed on the substrate is etched by using the etching vapor, the amount of the etching solution used may be decreased when compared to the etching of the electrode layer by using the etching solution.

The electrode layer may be formed by using a transparent conductive material.

The electrode layer may include, for example, polycrystalline indium tin oxide (p-ITO) or amorphous indium tin oxide (a-ITO). The p-ITO and the a-ITO are oxides in which $In_2O_3$ and $SnO_2$ are mixed in an appropriate mixing ratio.

The p-ITO and the a-ITO have good chemical resistance, and the etching thereof is not easy. Accordingly, when the p-ITO and the a-ITO are etched using the etching solution 10, an etching rate is low and residue may be generated. However, when the p-ITO and the a-ITO are etched using the etching vapor, the etching rate is fast, and generation of residue on the electrode layer may be prevented.

Any etching solution 10 that may etch the electrode layer may be used without specific limitation, and may include at least one acid selected from hydrochloric acid (HCl), nitric acid ($HNO_3$), sulfuric acid ($H_2SO_4$), phosphoric acid ($H_3PO_4$) and perchloric acid ($HClO_4$). The acid is generally an oxidizing agent and plays the role of etching the electrode layer.

The temperature of the thermostatic bath 40 may be from about 40° C. to about 80° C. When the temperature of the thermostatic bath 40 is less than about 40° C., the temperature is too low and the generation of the etching vapor through the heating of the etching solution 10 in the double boiler is difficult. When the temperature of the thermostatic bath 40 exceeds about 80° C., most of the etching solution 10 is vaporized, and the amount of the etching solution 10 lost into the air may increase.

The solvent 30 may be any solvent that generates the etching vapor through the heating of the etching solution 10 in the double boiler without specific limitation. For example, water may be used as the solvent. In some embodiments, the water may be de-ionized water.

Hereinafter an etching method of an electrode layer according to an embodiment will be explained.

Figure 2:
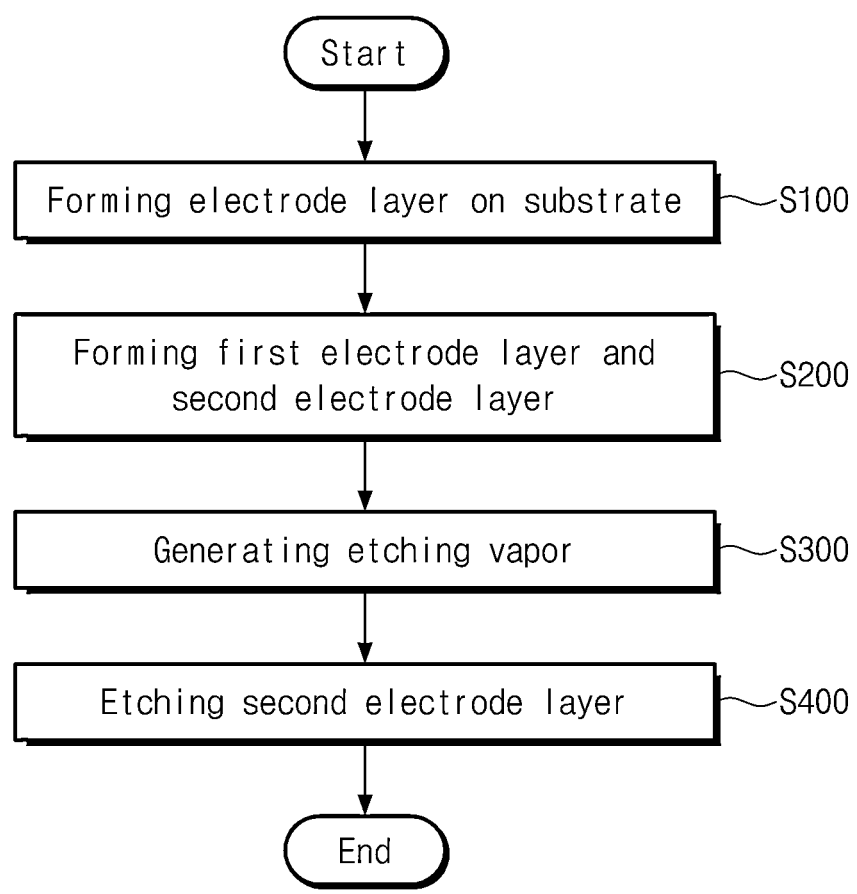
FIG. 2 is a flowchart illustrating an etching method of an electrode layer according to an embodiment.

FIG. 2 is a flowchart illustrating an etching method of an electrode layer according to an embodiment.

Referring to FIG. 2, the etching method according to an embodiment includes forming an electrode layer on a substrate (S100); forming a first electrode layer and a second electrode layer (S200); generating etching vapor by heating an etching solution in a double boiler (S300); and etching the second electrode layer through the etching vapor (S400).

FIGS. 3 to 8 are cross-sectional views illustrating an etching method of an electrode layer according to an embodiment.

Figure 3:
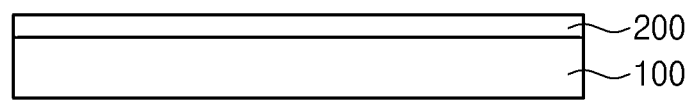
FIGS. 3 to 8 are cross-sectional views illustrating an etching method of an electrode layer according to an embodiment.

Referring to FIGS. 2 and 3, an electrode layer 200 is formed on a substrate 100 formed by using a transparent insulating material (S100). The substrate 100 may be any substrate commonly used without specific limitation and may be, for example, a glass substrate, a quartz substrate or the like.

The electrode layer 200 may be formed on the substrate 100 by any method commonly applied without specific limitation and may be, for example, a sputtering method, a chemical vapor deposition (CVD) method, a vacuum deposition method or the like.

The electrode layer 200 may be formed by depositing p-ITO or a-ITO.

Figure 4:
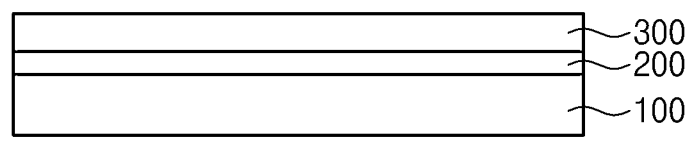
Figure 5:
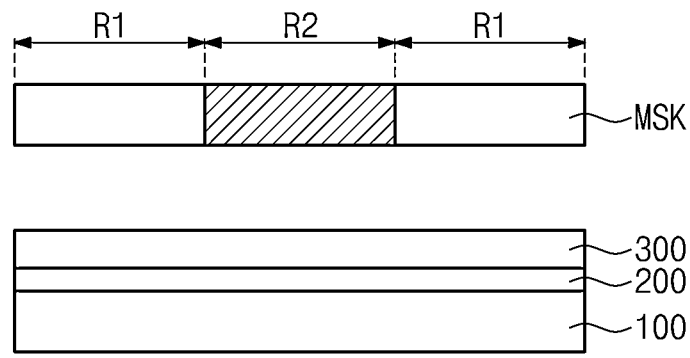

Then, referring to FIGS. 4 and 5, a photoresist 300 is coated on the electrode layer 200, and the photoresist 300 is exposed to a light through a mask MSK.

The mask MSK is provided with a first region R1 for shielding the irradiation of the light and a second region R2 for the transmission of the irradiating light. Only the light penetrating the mask MSK may irradiate the photoresist 300. The upper surface of the substrate 100 is positioned under the first region R1 and the second region R2 and is divided into regions corresponding to each region. Hereinafter each of the corresponding regions of the substrate 100 is also called as a first region R1 and a second region R2.

Figure 6:
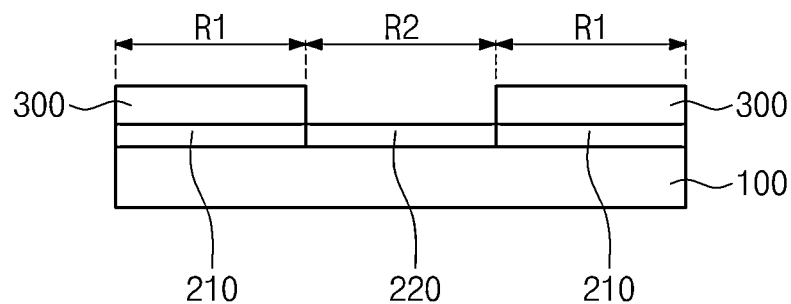

Then, the photoresist 300 exposed through the mask MSK is developed, and as illustrated in FIG. 6, the photoresist 300 remains and coats a certain thickness in the shielding region of the light through the first region R1, and the photoresist 300 is completely removed in the transmitting region of the light in the second region R2 to expose the surface of the electrode layer 200. The electrode layer 200 coated with the photoresist 300 is provided as the first electrode layer 210 and the electrode layer 200 uncoated with the photoresist 300 is provided as the second electrode layer 220.

Figure 7:
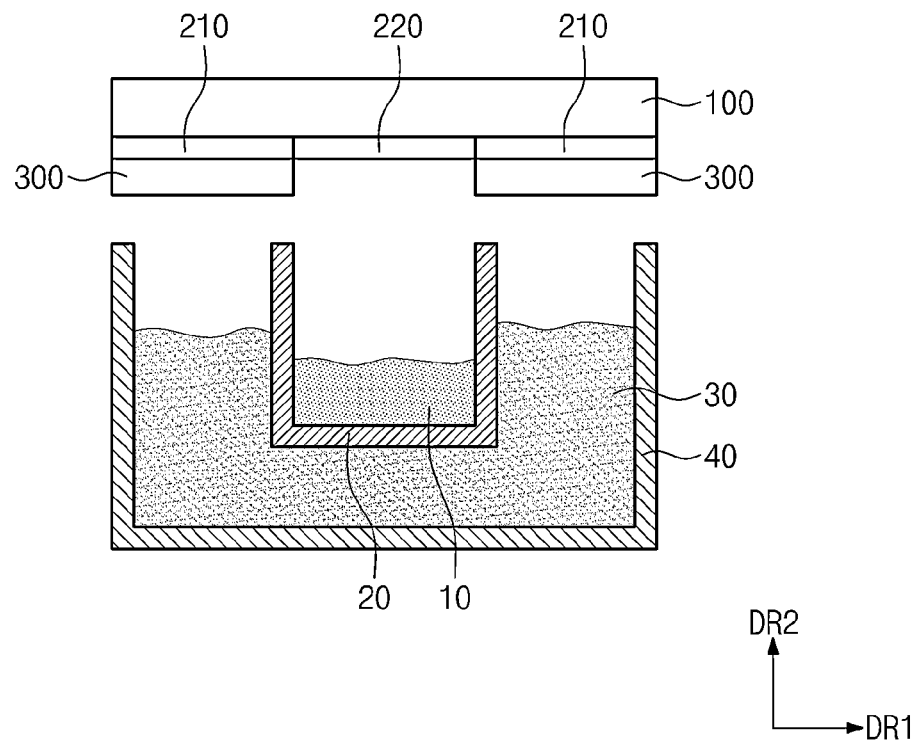
Figure 8:
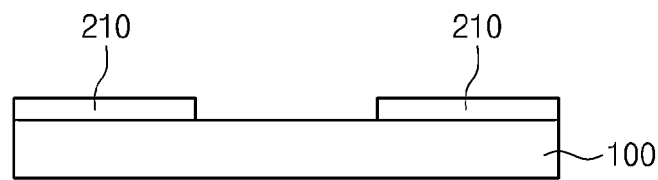

After that, referring to FIGS. 2 and 7, an etching solution 10 is heated in the double boiler to generate etching vapor (S300), and the second electrode layer 220 is etched through the etching vapor.

Heating in a double boiler may be performed in a thermostatic bath 40 having a temperature between about 40° C. and about 80° C. When the temperature of the thermostatic bath 40 is less than about 40° C., the temperature is too low and the generation of the etching vapor through the heating of the etching solution 10 in the double boiler may become difficult. When the temperature of the thermostatic bath 40 exceeds about 80° C., most of the etching solution 10 may be vaporized and the amount lost into the air may increase.

The etching method of an electrode layer according to an embodiment may further include disposing the substrate 100 on which the first electrode layer 210 and the second electrode layer 220 are formed, above the thermostatic bath 40. Referring to FIG. 7, the first electrode 210 and the second electrode 220 may be disposed so as to face the etching solution 10. By disposing the first electrode layer 210 and the second electrode layer 220 so as to face the etching solution 10, the second electrode layer 220 may be etched through the etching vapor.

The etching method of an electrode layer according to an embodiment may further include transporting the substrate 100 on which the first electrode 210 and the second electrode 220 are formed, in a parallel direction DR1 to the substrate 100. Through transporting the substrate 100 in the parallel direction DR1, an etching process may be performed continuously with respect to the plurality of the second electrode layers 220 formed on the substrate 100.

In addition, the etching method of an electrode layer according to an embodiment may further include transporting the thermostatic bath 40 in the parallel direction DR1 with respect to the substrate 100. Through transporting the thermostatic bath 40 in the parallel direction DR1, an etching process may be performed continuously with respect to the plurality of the second electrode layers 220 formed on the substrate 100.

Etching the second electrode layer 220 may be performed for about 10 to 60 seconds. When the etching is performed for less than about 10 seconds, the electrode layer may not be sufficiently etched, and when the etching is performed for greater than about 60 seconds, the etching vapor may make a chemical attack to at least one of the photoresist 300 and the first electrode layer 210.

Hereinafter a manufacturing method of a display substrate according to an embodiment will be explained.

Figure 9:
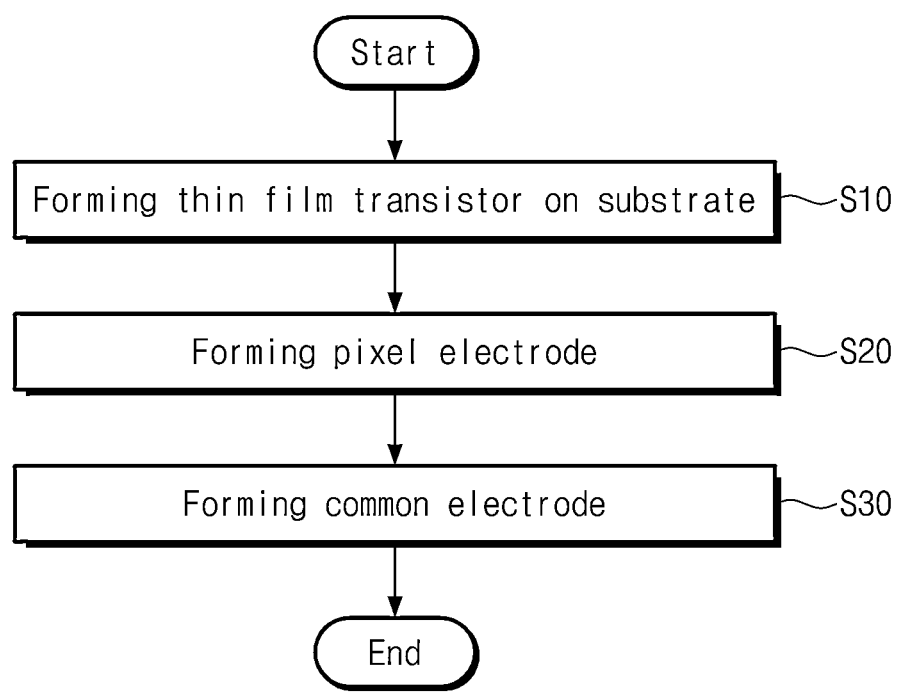
FIG. 9 is a flowchart illustrating a manufacturing method of a display substrate according to an embodiment.

FIG. 9 is a flowchart illustrating a manufacturing method of a display substrate according to an embodiment.

The manufacturing method of the display substrate according to an embodiment includes forming a thin film transistor on a substrate (S10); forming a pixel electrode connected to the thin film transistor (S20); and forming a common electrode insulated from the pixel electrode (S30).

At least one of forming the pixel electrode (S20) and forming the common electrode (S30) includes forming an electrode layer on a substrate (S100); coating a photoresist to form a first electrode layer on which the photoresist is coated and a second electrode layer on which the photoresist is not coated (S200); generating etching vapor by heating an etching solution in a double boiler (S300); and etching the second electrode layer through the etching vapor (S400).

Figure 10:
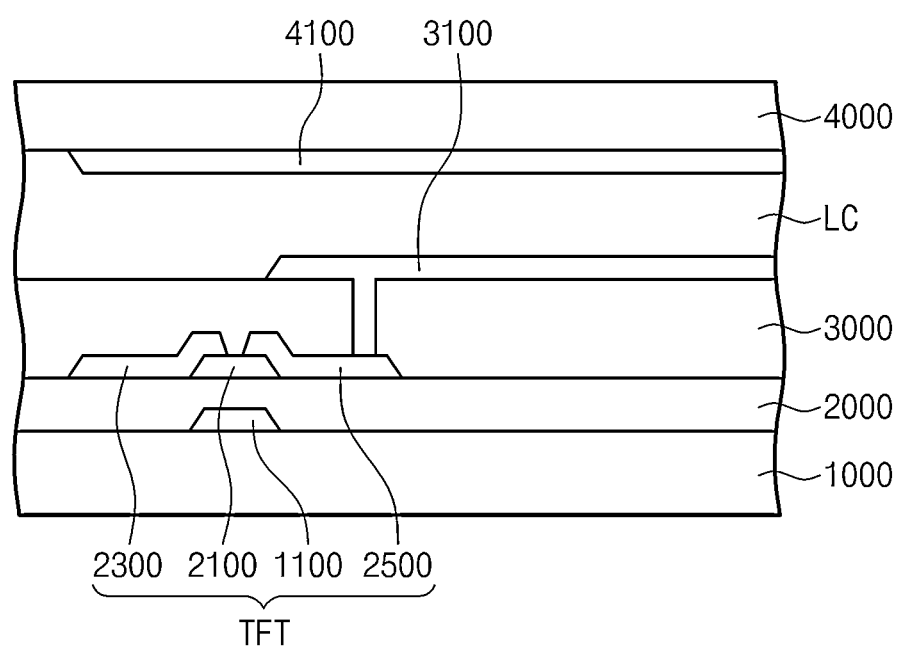
FIG. 10 is a cross-sectional view illustrating a portion of a display substrate manufactured by the manufacturing method of a display substrate illustrated in FIG. 9.
Figure 11A:
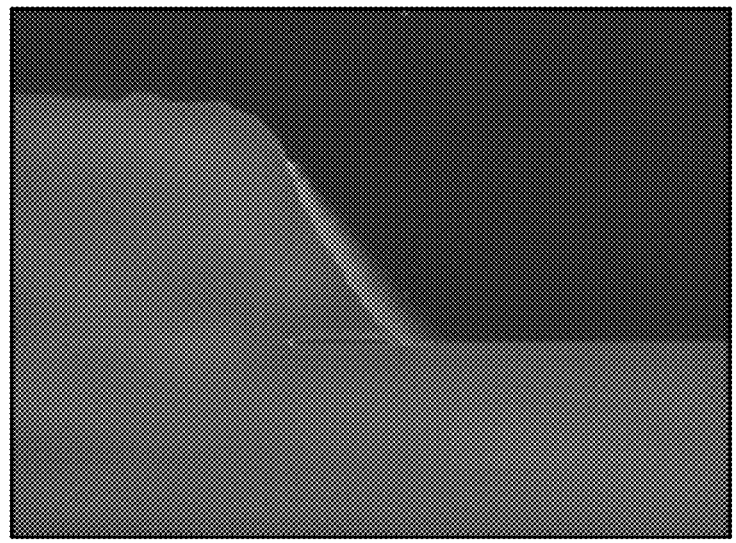
FIGS. 11A and 11B are SEM photographic images taken by an electron scanning microscope on a sample etched by Example 1.
Figure 11B:
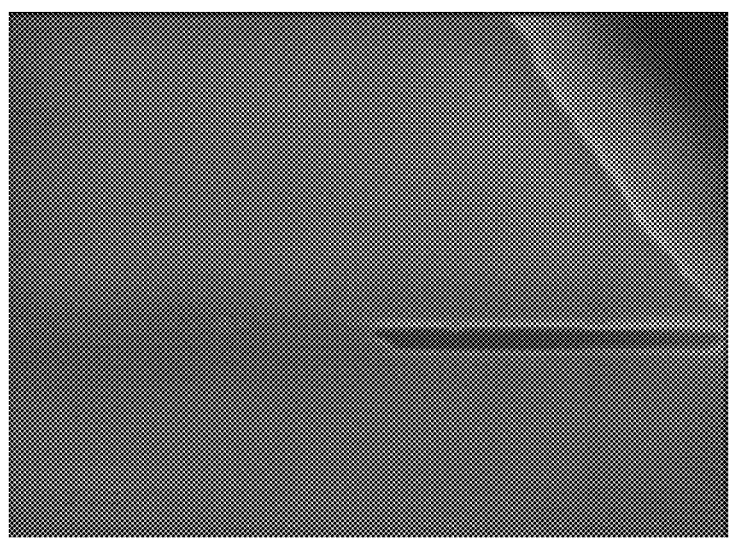
Figure 12A:
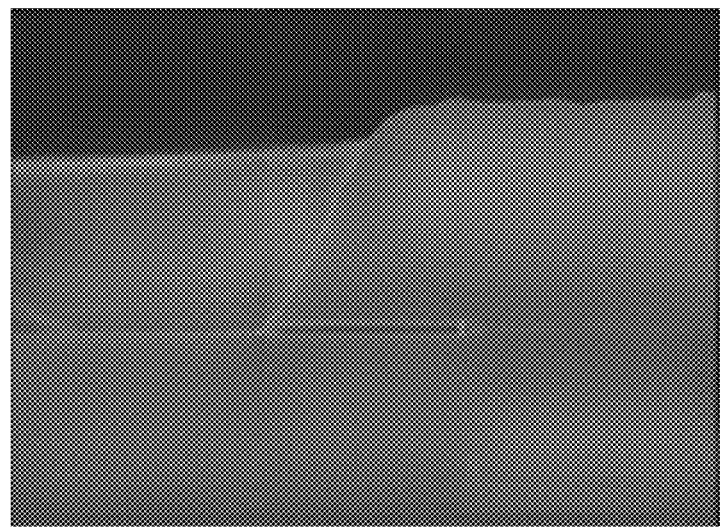
FIGS. 12A and 12B are SEM photographic images taken by an electron scanning microscope on a sample etched by Example 2.
Figure 12B:
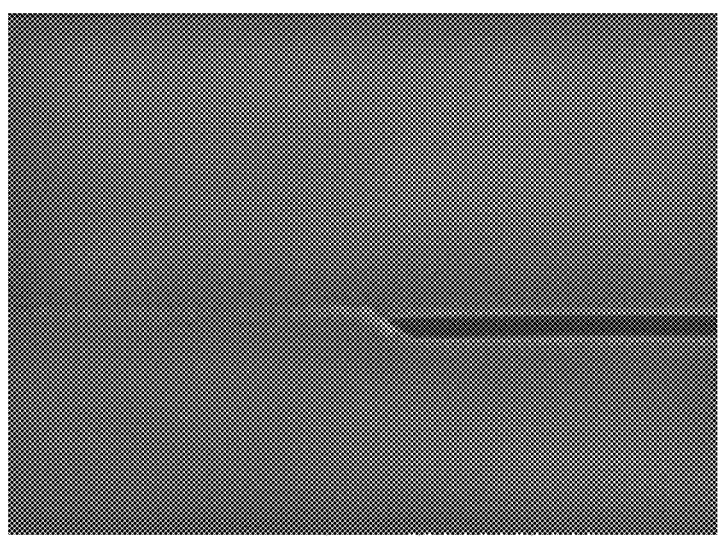
Figure 13A:
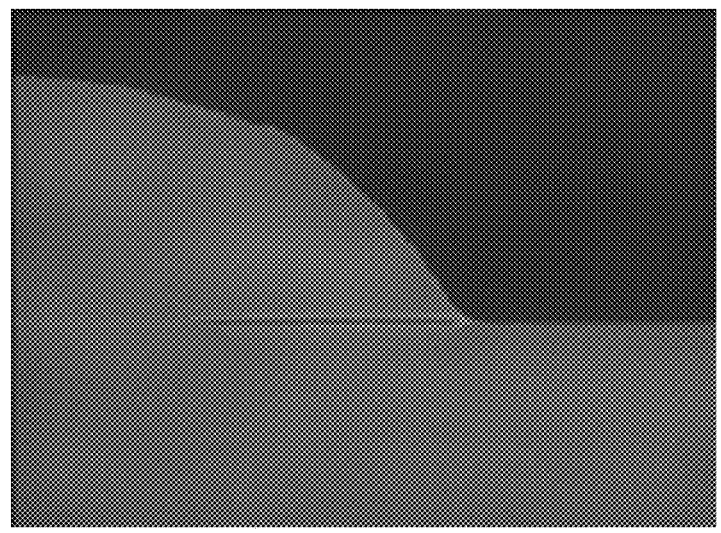
FIGS. 13A and 13B are SEM photographic images taken by an electron scanning microscope on a sample etched by Example 3.
Figure 13B:
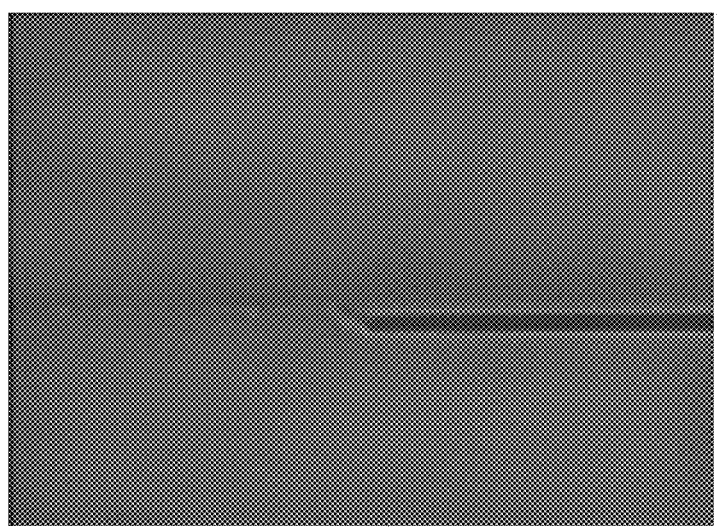
Figure 14A:
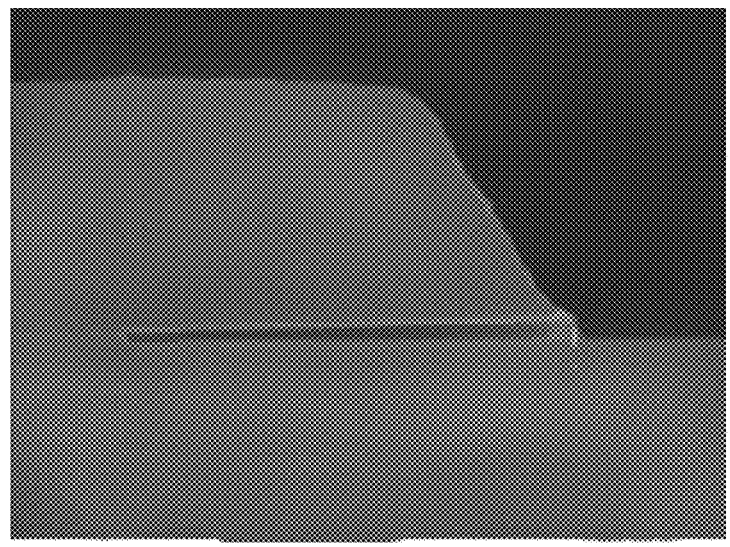
FIGS. 14A and 14B are SEM photographic images taken by an electron scanning microscope on a sample etched by Example 4.
Figure 14B:
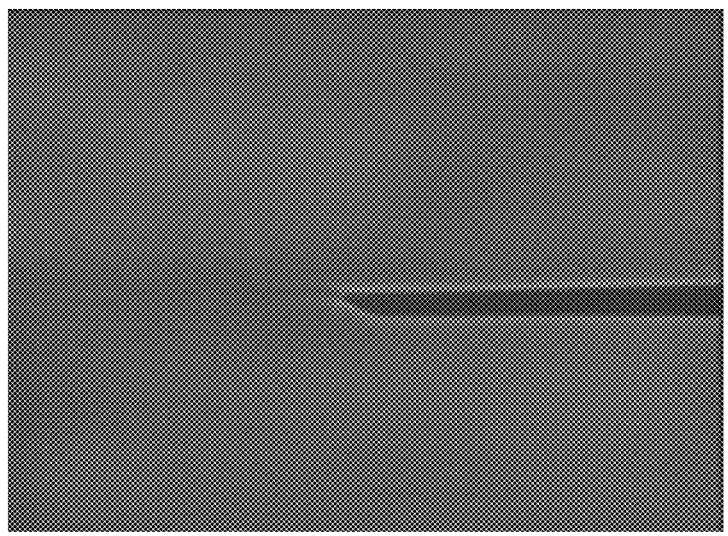

FIG. 10 is a cross-sectional view illustrating a portion of a display substrate manufactured by the manufacturing method of a display substrate illustrated in FIG. 9.

Referring to FIG. 10, the display substrate includes a thin film transistor (TFT), and the TFT includes a gate electrode 1100, a gate insulating layer 2000, a semiconductor pattern 2100, a source electrode 2300 and a drain electrode 2500. The TFT is formed through patterning by means of a photolithography process.

Referring to FIGS. 9 and 10 first, the TFT is formed on the substrate 1000 (S10). The forming of the TFT is as follows.

A gate electrode 1100 is formed on the substrate 1000. On the substrate 1000 on which the gate electrode 1100 is formed, a gate insulating layer 2000 is formed. The gate insulating layer 2000 is on the gate electrode 1100 to cover the gate electrode 1100.

Then, the semiconductor pattern 2100 is formed on the gate insulating layer 2000. The semiconductor pattern 2100 faces the gate electrode 1100 with the gate insulating layer 2000 therebetween.

The source electrode 2300 and the drain electrode 2500 are formed on the semiconductor pattern 2100. The source electrode 2300 and the drain electrode 2500 are separated from each other and are connected to the semiconductor pattern 2100.

An insulating layer 3000 may be further formed on the source electrode 2300 and the drain electrode 2500.

Then, referring to FIGS. 9 and 10, a pixel electrode 3100 connected to the TFT comprising the gate electrode 1100, the gate insulating layer 2000, the semiconductor pattern 2100, the source electrode 2300 and the drain electrode 2500 is formed (S20). The pixel electrode 3100 may be on the insulating layer 3000. The pixel electrode 3100 may be formed by using p-ITO or a-ITO, however is not limited thereto.

Then, referring to FIGS. 9 and 10, a common electrode 4100 insulated from the pixel electrode 3100 is formed (S30). The common electrode 4100 may be formed on a color filter substrate 4000 or on the substrate 1000 on which the TFT is formed. The common electrode 4100 may be also formed by using p-ITO or a-ITO, however is not limited thereto.

Between the substrate 1000 on which the TFT is formed and the color filter substrate 4000, a liquid crystal layer LC may be formed.

Referring to FIGS. 2 and 9, at least one of forming the pixel electrode (S20) and forming the common electrode (S30) includes forming an electrode layer on a substrate (S100); coating a photoresist to form a first electrode layer on which the photoresist is coated and a second electrode layer on which the photoresist is not coated (S200); generating etching vapor by heating an etching solution in a double boiler (S300); and etching the second electrode layer through the etching vapor (S400).

The processes included in forming the pixel electrode (S20) and forming the common electrode (S30) follow the etching method of an electrode layer according to an embodiment as described above. The first electrode layer etched by the etching method of an electrode layer according to an embodiment may form at least one of the pixel electrode and the common electrode. Hereinafter particular explanation on forming the pixel electrode (S20) and forming the common electrode (Step S30) will be omitted.

The following examples are provided to support the understanding of the inventive concept, and the scope of the inventive concept is not limited thereto.

Formation of Sample

An a-ITO layer was formed on a glass substrate to the thickness of about 550 Å. On the a-ITO layer, a photoresist was coated in a certain shape, and the photoresist coated substrate was cut into about 550H650 mm by using a diamond knife to form a sample.

Example 1

An etching solution (a HCl solution of about 35 wt %) was held in a container, and the container was put in a thermostatic bath. De-ionized water was used for heating in a double boiler.

The sample thus formed was disposed above the thermostatic bath so that the a-ITO layer faced the etching solution.

Then, the thermostatic bath was heated to about 60° C., and an etching process was performed for about 10 seconds.

Example 2

An etching process was performed for about 20 seconds by the same conditions as in Example 1.

Example 3

An etching process was performed for about 30 seconds by the same conditions as in Example 1.

Example 4

An etching process was performed for about 60 seconds by the same conditions as in Example 1.

Experimental Example 1

Evaluation of Etching Properties

After performing the etching processes in Examples 1 to 4, the samples were washed using de-ionized water and dried by using a hot air drying apparatus. Then, the photoresist was removed by using a photoresist stripper. After performing the washing and drying, SEM photographs were taken by using an electron scanning microscope and the photographs are illustrated in FIGS. 11 to 14. In addition, etching properties were evaluated and are illustrated in the following Table 1.

TABLE 1

|  | CD skew (one side) (μm) | Taper angle (T/A, degree) | residue |
| --- | --- | --- | --- |
| Example 1 | 0.64 to 0.66 | 33 to 34 | None |
| Example 2 | 1.15 to 1.16 | 33 to 36 | None |
| Example 3 | 1.52 to 1.55 | 36 to 38 | None |
| Example 4 | 2.30 to 2.40 | 32 to 38 | None |

As shown in the above Table 1, the samples etched using the HCl solution of about 35 wt % according to Examples 1 to 4 have low CD skew values (all less than about 3.0 μm). In addition, the taper angles were good and from about 32 to about 38 degrees. When referring to FIGS. 11 to 14, no residue was seen in the samples etched according to Examples 1 to 4, and the etching properties were good.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An etching method comprising:
   forming an electrode layer on a substrate;
   coating a photoresist on the electrode layer to form a first electrode sub-layer on which the photoresist is coated and a second electrode sub-layer on which the photoresist is not coated;
   generating etching vapor by heating an etching solution in a double boiler; and
   etching the second electrode sub-layer by using the etching vapor.

2. The etching method of claim 1, wherein heating the etching solution in the double boiler is performed in a thermostatic bath between about 40° C. and about 80° C.

3. The etching method of claim 2 further comprising disposing the substrate above the thermostatic bath.

4. The etching method of claim 3, wherein the substrate is disposed above the thermostatic bath so that the first electrode sub-layer and the second electrode sub-layer face the etching solution.

5. The etching method claim 4 further comprising transporting the substrate in a parallel direction to the substrate.

6. The etching method of claim 4 further comprising transporting the thermostatic bath in the parallel direction.

7. The etching method of claim 1, wherein etching the second electrode sub-layer is performed for about 10 to about 60 seconds.

8. A manufacturing method of a display device, the method comprising:
    forming a thin film transistor on a substrate;
    forming a pixel electrode connected to the thin film transistor; and
    forming a common electrode insulated from the pixel electrode,
    wherein at least one of forming the pixel electrode and forming the common electrode comprises:
        forming an electrode layer on the substrate;
        coating a photoresist on the electrode layer to form a first electrode sub-layer on which the photoresist is coated and a second electrode sub-layer on which the photoresist is not coated;
        generating etching vapor by heating an etching solution in a double boiler; and
        etching the second electrode sub-layer by using the etching vapor.

9. The manufacturing method of a display device of claim 8, wherein heating the etching solution in the double boiler is performed in a thermostatic bath between about 40° C. and about 80° C.

10. The manufacturing method of a display device of claim 9 further comprising disposing the substrate above the thermostatic bath.

11. The manufacturing method of a display device of claim 10, wherein the substrate is disposed above the thermostatic bath so that the first electrode sub-layer and the second electrode sub-layer face the etching solution.

12. The manufacturing method of a display device of claim 11 further comprising transporting the substrate in a parallel direction to the substrate.

13. The manufacturing method of a display device of claim 11 further comprising transporting the thermostatic bath in the parallel direction.

14. The manufacturing method of a display device of claim 8, wherein etching the second electrode sub-layer is performed for about 10 to about 60 seconds.

15. An etching device comprising:
    a container holding an etching solution;
    a thermostatic bath holding the container therein and comprising a heated solvent configured to heat the etching solution in a double boiler to produce etching vapor; and
    an electrode layer formed on a substrate, whereby the etching vapor produced by the etching solution heated in the double boiler is configured to etch the electrode layer.

16. The etching device of an electrode layer of claim 15, wherein the electrode layer comprises at least one of polycrystalline indium tin oxide (a-ITO) and amorphous indium tin oxide (a-ITO).

17. The etching device of an electrode layer of claim 15, wherein the etching solution comprises at least one of hydrochloric acid (HCl), nitric acid ($HNO_3$), sulfuric acid ($H_2SO_4$), phosphoric acid ($H_3PO_4$) and perchloric acid ($HClO_4$).

18. The etching device of an electrode layer of claim 15, wherein a temperature of the thermostatic bath is from about 40° C. to about 80° C.

19. The etching device of an electrode layer of claim 15, wherein the solvent is water.

* * * * *